United States Patent [19]
Lam

[11] Patent Number: 5,990,739
[45] Date of Patent: Nov. 23, 1999

[54] ANALOG SIGNAL AMPLIFIER

[76] Inventor: Peter Ar-Fu Lam, 20104 Wayne Ave., Torrance, Calif. 90503

[21] Appl. No.: 09/010,440

[22] Filed: Jan. 22, 1998

[51] Int. Cl.[6] .................................................... H03F 3/217
[52] U.S. Cl. ...................................... 330/251; 330/207 A
[58] Field of Search ......................... 330/10, 146, 207 A, 330/251; 381/120

[56] References Cited

U.S. PATENT DOCUMENTS

| | | | |
|---|---|---|---|
| 4,092,610 | 5/1978 | White et al. ......................... | 330/207 A |
| 4,910,416 | 3/1990 | Salcone ................................ | 330/251 X |
| 5,382,915 | 1/1995 | Muri et al. .......................... | 330/251 X |
| 5,398,003 | 3/1995 | Heyl et al. .......................... | 330/251 X |

*Primary Examiner*—Steven J. Mottola

[57] ABSTRACT

A low cost analog signal amplifying circuit suitable for manufacturing in the form of an integrated circuit having an external load, an external signal control element and switching circuit means to reverse the direction of current flowing through said load.

32 Claims, 5 Drawing Sheets

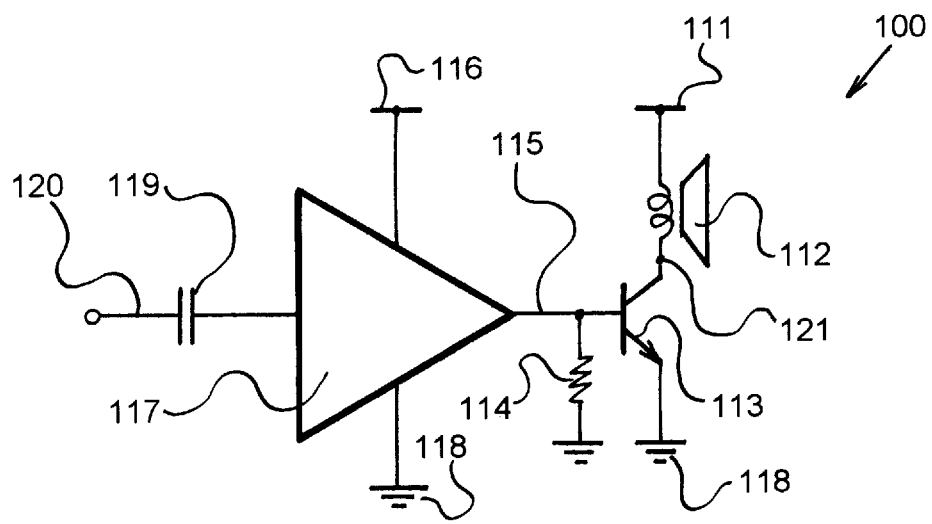
FIG. 1 PRIOR ART
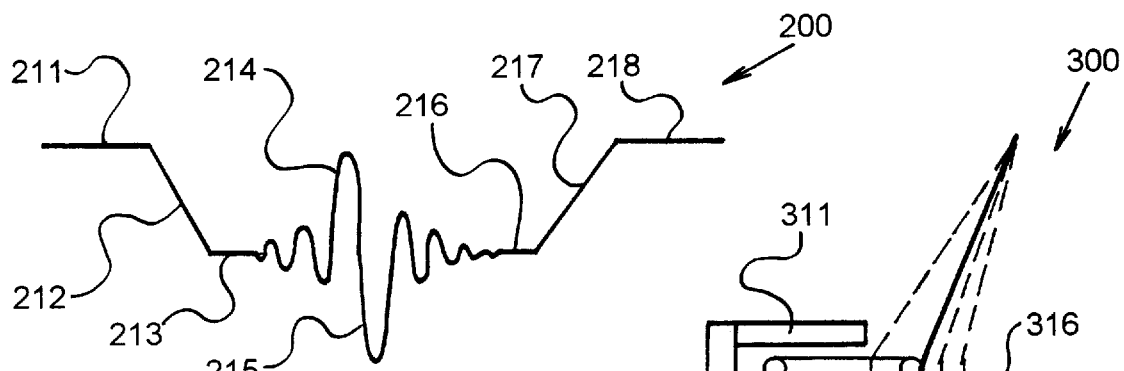
FIG. 2A
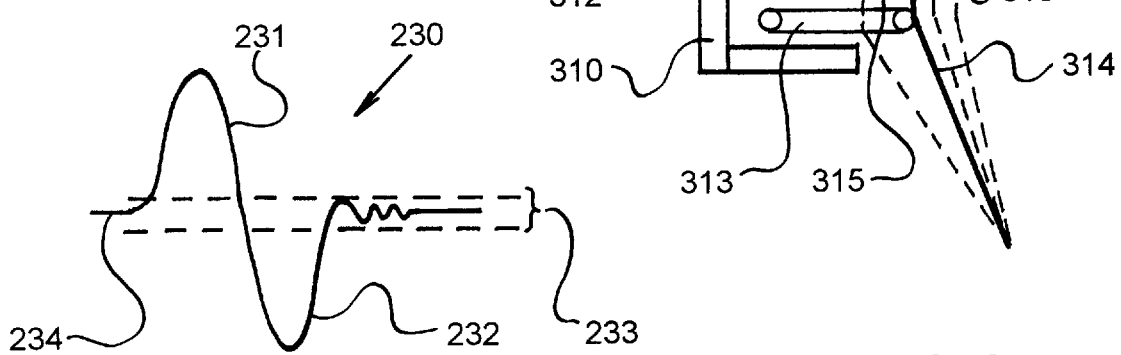
FIG. 2B
FIG. 3

ANALOG SIGNAL AMPLIFIER

FIELD OF THE INVENTION

The present invention relates to a low cost, low output impedance amplifier, particularly to an amplifier delivering an analog signal to a low impedance load such as a speaker.

BACKGROUND OF THE INVENTION

Traditional low cost audio amplifying circuit used by consumer electronic products makes use of class A amplifier or push pull amplifier. Current driving class A amplifier is very popular in low end voice synthesizing chips, melody chips and sound effect chips due to its simplicity and low cost. The major disadvantage of the class A amplifier and push pull amplifier is the poor power efficiency. Another disadvantage of single transistor class A amplifier is that the output signal usually suffers from the nonlinear distortion resulted from the nonlinear transfer curve of the driving transistor. The objective of the invention is to develop a low cost high efficiency analog signal amplifier particularly suitable for use to drive an audio signal to a speaker.

SUMMARY OF THE INVENTION

The present invention is directed to the design of a low cost high efficiency analog signal amplifier; particularly an amplifier built into an integrated circuit, hereafter referred as an IC. Traditional low cost class A amplifier making use of a single transistor offers low component cost. The amplifier IC cost is reduced because only a small base current is to be delivered to the driving transistor and therefore eliminating the requirement of the integrated circuit to handle high power dissipation. This circuit is commonly used in low cost consumer products making use of a voice or sound synthesizer chip; voice recording/playback chips and melody chips in which the audio signal represented by digital data is converted into an analog signal to be delivered to the base of a driving transistor. The disadvantage of this arrangement is that the speaker is driven in a unipolar direction such that only half of the dynamic range of the speaker is utilized. The circuit is required to build up a midpoint bias level for the driving transistor during the idle or cross over period of a sound wave. The midpoint biasing level contributes a DC current flowing through the load when there is no input signal. A further disadvantage of the single transistor class A amplifier is the nonlinear transfer curve of the driving transistor which provides a significant non linear distortion to the output waveform. Another commonly used analog signal amplifier is the arrangement of a push pull circuitry wherein one transistor is arranged to source current from the speaker and another one is arranged to sink current from the speaker. If the output current is AC coupled to the speaker, the unipolar direction disadvantage discussed above is eliminated. This circuit is represented by the commonly used audio amplifier LM386 in the form of an integrated circuit. The typical disadvantage of this arrangement is that there is a possibility of cross over distortion when the output signal is hand over from the sourcing transistor to the sinking transistor or vice versa. The power driving capability of the amplifier is also limited by the power dissipation capable to be handled by the integrated circuit.

The objective of the present invention is to provide a circuit design configuration suitable for using by the low cost sound or melody chips, making use of the full dynamic range of the speaker and completely eliminating the midpoint DC biasing level. Another objective of the invention is to provide a low cost analog signal amplifier in the form of an IC.

In a preferred embodiment, the source signal is processed to provide a suitable base current to the driving or amplifying transistor. The transistor in turn amplifies the input signal and drive the output current through the load. In a typical application of an audio amplifier, the load is represented by a loud speaker. The first terminal of the load is connected to a first switch which may connect the terminal to a power source, to the amplifying transistor or simply be turned off. The second terminal of the load is connected to a second switch which is also capable of connecting the second terminal to the power source, the amplifying transistor or turned the current off. During the upper portion cycle time of an input signal, the first switch connects the first terminal to the power source and the second switch connects the second terminal to the amplifying transistor. In this situation, the amplified signal current flows through the load in a first direction. During the lower portion cycle time of the input signal, the second switch connects the second terminal to the power source and the first switch connects the first terminal to the same amplifying transistor. In this situation, the amplified signal current flows through the load in a second opposite direction. The configuration therefore provides a bidirectional load current to the speaker.

When the movement of the speaker diaphragm is analyzed, it can be observed that during the upper portion cycles time, the diaphragm moves to a first direction and during the lower portion cycle time, the diaphragm moves to a second opposite direction. It means both the dynamic range of the speaker diaphragm in the first and second directions are fully utilized and higher sound pressure is produced as compared with the unidirectional movement of the traditional single transistor low cost class A amplifiers. When the signal voltage acrossing the speaker terminals is considered, it can be observed that the invented design offers double driving voltage across the speaker when compared with traditional audio amplifiers. In each of the peak swing upper or lower portion cycle time of the signal, the voltage across the speaker terminals can be approximately equal to the voltage of the power source minus the saturated voltage drop of the driving transistor. That is represented by the equation "Vs−Vce", where Vs is the power source voltage and Vce is the saturated voltage drop of the driving transistor. Assuming Vs=6V, Vce=0.3V per amplifying or switching transistor, a 5.1V peak voltage swing is achievable for each of the upper and the lower portion cycle time. It means the present invention is capable of offer 10.2V peak to peak signal swing across the speaker as compared with 5.7Vpp in traditional single transistor class A amplifier or 4.6Vpp as achieved by traditional push pull amplifier under the similar power source situation. The higher peak to peak voltage swing implies higher power is possible to be delivered by the invented single transistor circuit design. If the power to be delivered to the load is to be maintained when compared with traditional amplifier discussed, the higher voltage swing implies the impedance of the load can be increased and eventually the current delivered to the amplifier can be reduced in proportion. When compared with prior art single transistor class A amplifier, the DC biasing component of the current is eliminated and four times reduction in peak operation current is possible to maintain the same output power depends on the input signal amplitude. Research of the inventive steps indicates that the reduction of the peak operating current has a significant meaning to the power efficiency of battery operated devices although the output power is maintained at the same level. This is partially because typical alkaline and carbon zinc has a different power capacity when discharged at different current. The total ampere-hour of a battery is longer when being discharged at a lower current. The current characteristic of the present invention combined with the battery capacity versus loading current characteristic indicates that battery life of apparatus making use of the invented circuit can be significantly extended when compared with traditional low cost single transistor class A amplifier; even for the same power is to be delivered to the speaker. Experimental study indicates that battery life can be easily extended by more than two times depends on the range of operating current. Substantial higher battery efficiency without sacrificing the power performance reduces the quantity of consumer battery dumping and therefore significantly helps to improve the green environment of the earth.

In the situation of an integrated circuit, the amplifying transistor is preferably to be arranged external to the IC so that the heat dissipation shared with the load mainly concentrates on the external power transistor. The IC delivers only a small base current enough to drive the transistor and therefore very little heat energy is dissipated on the IC. This low power arrangement is very helpful to simplify the heat tolerance and power handling requirement when designing the IC which in turn enable a smaller IC size, and simpler packaging requirement. Eventually the cost of the IC is significantly reduced. It should be noted that the amplifying transistor is not limited to regular NPN or PNP power transistors, but also includes other analog signal control means or amplifying devices such as FET, MOS, CMOS or integrated power amplifiers.

The source signal to be amplified can be an external signal derived from an external source as in the example of an audio speaker amplifier. Alternatively, it can be an analog signal decoded from digital data as in the example of a sound or melody chip. Such digital data can be stored inside a processing integrated circuit as in the case of sound chips or stored in memory outside said integrated circuit as in the design of some telephone answering or voice recording/playback chips.

Due to the nonlinear transfer curve of the driving transistor, the input base current is preferably to be compensated according to different amplitude of the input signal so as to provide a more linear transfer characteristic. In the situation of a digital to analog conversion as in the example of a sound or melody chip, the decoded digital sample can go through a look up table which provides an image opposite transformation to the nonlinear characteristic of the driving transistor and in turn compensate and transform the output signal to provide a more linear transfer characteristic. Many other linearity compensation techniques disclosed in prior art inventions and common to skill in the trade can also be integrated into the invention to provide a linear amplification of the source signal.

In an alternate embodiment, the output signal in between the driving transistor and the connected terminal can be feedback to the amplifying circuit for gain compensation due to variation of individual transistor gains. Various gain compensation methods in the art with a feedback design is applicable to improve the performance of the invention.

The use of a single transistor provides another significant advantage when compared with traditional push pull signal amplifier. Nonlinear distortion is frequently introduced into the loading current of push pull amplifier due to different transfer characteristics or different amplifying factor (beta) of the sourcing and sinking transistors. Because a single transistor is used in the present invention, the transfer characteristic is always identical during both the upper and lower portions of the amplifying signal.

In addition to the cost saving of one power transistor as in the traditional push pull amplifier, another advantage of the single transistor design is that the amplifying transistor is always servicing both the upper and lower portion of the signal, there is no worry for both the current sourcing and sinking transistors to be turned on or turn off at the same time as in the situation of traditional push pull amplifier design. It means the single transistor design naturally eliminates the cross over distortion faced by traditional push pull power amplifier.

When the invented technology is applied into a voice decoding device making use of DM (Delta Modulation) or ADPCM, the exact zero crossing may be difficult to be determined because every sample of the signal is relative to the previous signal sample decoded. A pop sound may happen when there is a small DC level exists across the speaker and the driving signal transits between the relative positive cycle time and the relative negative cycle time. Because there is no DC biasing across the speaker, the slope method of avoiding the pop sound as shown in waveform FIG. 2A is no longer applicable. In order to avoid the pop sound, the current feeding through the speaker is preferably be cut off either by turning off the amplifying transistor or the signal switches.

The invented technology is applicable to audio amplifiers, either in analog form or in digital form, where the digital data is eventually converted into an analog signal to drive a load as in the application of sound generating chips, answering machine chips and other type of voice recording/playback chips used in various consumer electronic products. In additional to audio amplifiers, embodiments of the invention finds utility in other analog signal driving applications, for example, variable speed DC motor and servomechanism.

The novel features of the invention are set forth with particularly in the appended claims. The invention will be best understood from the following description when read in conjunction with the accompanying drawings.

BRIEF DESCRIPTION OF DRAWINGS

FIG. 1 is a traditional single transistor audio driving circuit to drive a speaker.

FIG. 2A is a typical audio signal waveform to be delivered to the speaker load.

FIG. 2B illustrates the upper and lower portion cycle duration of an analog signal.

FIG. 3 is the sectional illustration of a speaker.

DESCRIPTION OF THE PREFERRED EMBODIMENT

Figure 4:
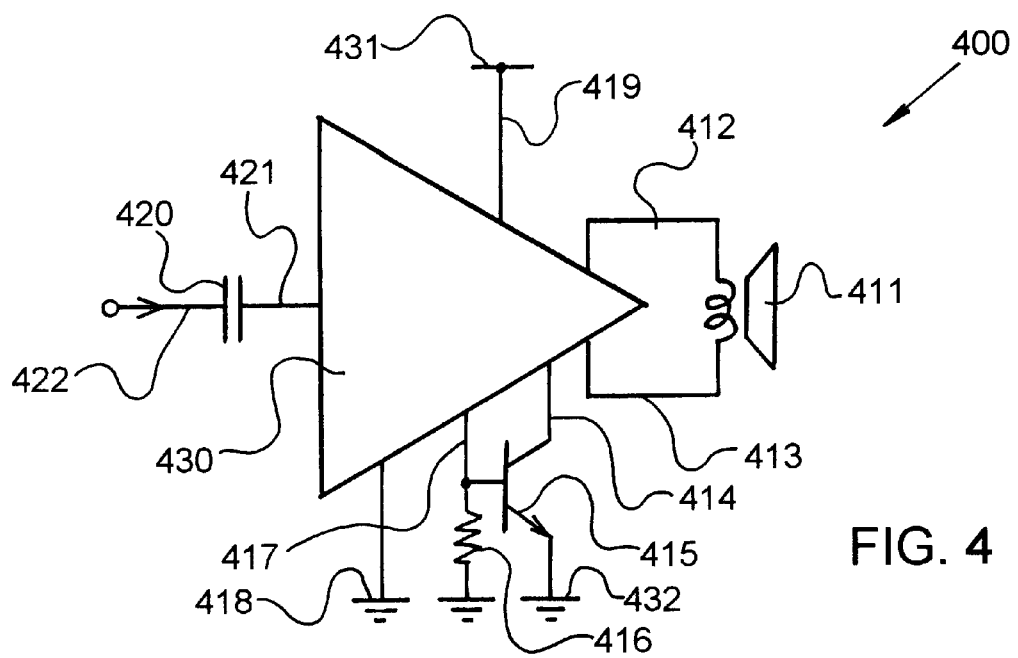
FIG. 4 is the schematic illustration of the invented audio amplifier.

FIG. 1 shows a traditional single transistor audio driving circuit 100 to drive a speaker 112. An analog source signal such as an audio signal is fed into the amplifier 117 configured as an integrated circuit (I.C.). The capacitor 119 eliminates the DC component of the source signal. The processed signal is fed into the base of an amplifying element, which is represented by the NPN transistor 113. The resistor 114 adjusts the base current allowed to flow into the amplifying transistor 113. The amplified current flow through the load, represented by the speaker 112 and the amplifying transistor 113.

FIG. 2A illustrates the waveform of a typical signal measured at junction 121 of FIG. 1. Before an effective signal is processed, the output of the transistor 113, that is junction 113 stays at high voltage level proximate to the power source voltage (Vs) potential at junction 111. The voltage at junction 121 is then lowered to approximately half of Vs to level 213 before a signal is to be produced. This is referred as providing the biasing of the amplifying transistor 113. The signal amplified comprises of the upper portion cycle period 214 and lower portion cycle period 215. After the signal is produced, the voltage at junction 121 returns to power source level 218. The voltage slopes 212 and 217 are preferably to be added by the amplifying circuit to eliminate the pop sound generated by the sudden rise and fall of the source waveform. FIG. 2B illustrates a typical analog signal 230 comprising an upper portion cycle 231 and a lower portion cycle 232. The zero signal level is represented approximately by the mean signal level 234. This signal can be passed into a zero crossing detector illustrated in FIG. 9 to provide an upper portion signal control pulse during the upper portion of the signal 231 and another lower portion signal control pulse during the lower portion of the signal 232. When a small feed back signal is provided to the zero crossing detector, a hysteresis effect can be introduced such that there is a small signal region 233 when neither the upper signal portion control pulse not the lower signal portion control pulse is generated. The presence of the no signal or small signal region 233 is significant to the power efficiency of the circuit 100 of FIG. 1 since the midpoint biasing level represents a steady DC power dissipation occurs in both the speaker 112 and the transistor 113.

Attention is now directed to FIG. 3, which shows the location of a diaphragm of a speaker receiving the analog signal of FIG. 2A. 300. The speaker comprises of a diaphragm 314 to move the air and produce sound. The diaphragm 314 is attached to a coil 313 which is positioned inside the magnetic field formed by the magnet 312 and the magnetic circuit 310, 311. A variable current representing the audio signal passing through the moving coil 313 causes the diaphragm 314 to move according to the amplitude and direction of the signal received. When no current is received as in region 211 or 218 of the waveform shown in FIG. 2A, the speaker diaphragm 314 stays at the equilibrium position 316. The small signal midpoint biasing level of the signal 213 and 216 is represented by the position 317 of the diaphragm. The peak signal level 215 is represented by the diaphragm position 318. It can be observed that in the situation of a single transistor class A amplifier shown in FIG. 1, the speaker diaphragm travels in between the positions 316 and 318. Besides, it requires a heat dissipating DC bias level 213 and 216 which is represented by the unstable diaphragm position 317.

Figure 5:
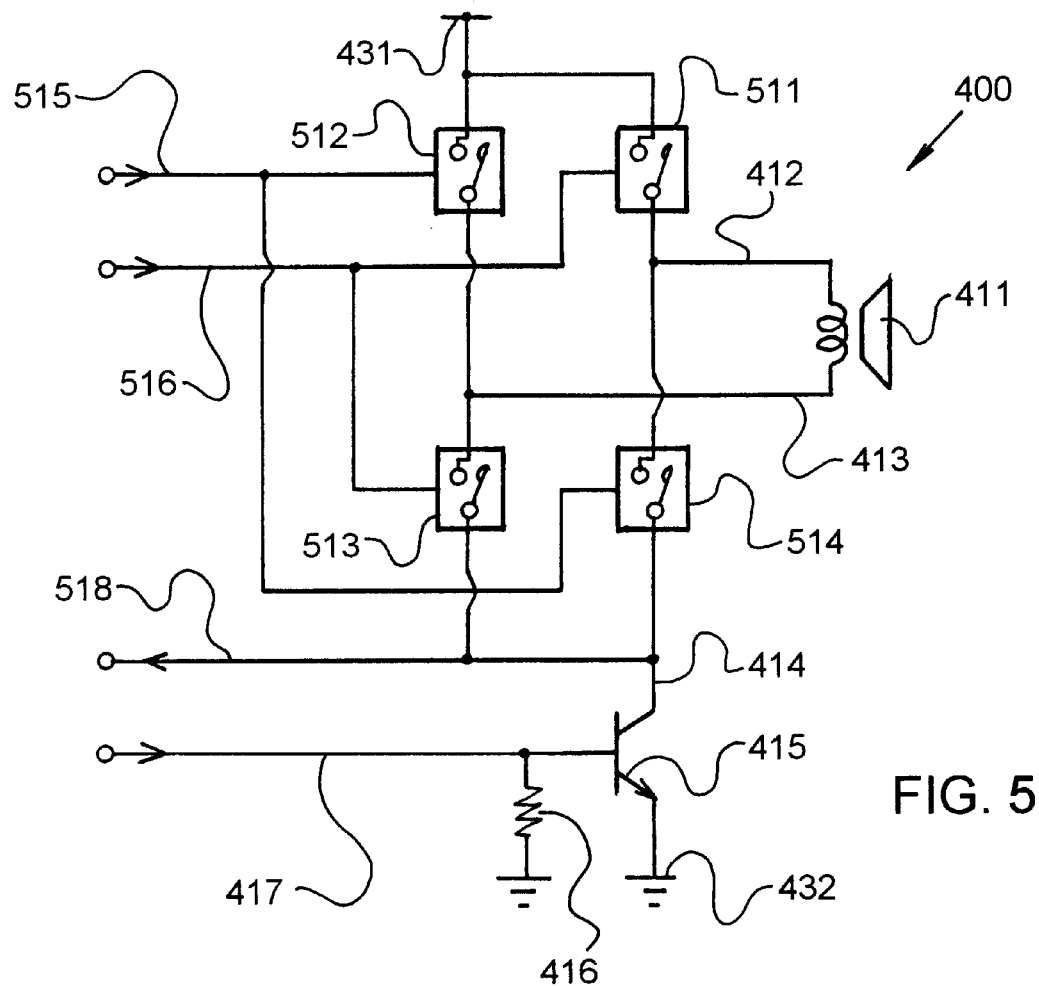
FIG. 5 is an embodiment of the invented audio amplifier.

The invented power amplifier 400 is illustrated in FIG. 4. It makes use of a single amplifying transistor 415 which is not connected directly to the load represented by the speaker 411 as compared with the traditional single transistor class A amplifying circuit shown in FIG. 1. The two terminals 412 and 413 of the speaker 411 are also connected to the amplifying circuit 430 instead of the transistor 415. The isolation between the speaker and the driving transistor is to enable the insertion of switching circuit means, which are illustrated in FIG. 5. In between the speaker 411 and the driving transistor 415 are two pairs of switching circuit 511, 512, 513 and 514. These switching circuits are driven by two control signals 515 and 516. During the upper portion cycle time 214, 231 of the signal, switch control 516 turns on switches 511 and 513 and switch control signal 515 turns off switches 512 and 514. During the lower portion cycle time of the signal, switch control signal 515 turns on switches 512 and 514 and switch control signal 516 turns off switches 511 and 513. Under this situation, the speaker terminal 412 is connected to the power source 431 through switch 512 and the speaker terminal 413 is connected to the collector of the transistor 415 through switch 514. It should be noted that the speaker polarity is reversed when compared with the switching circuit arrangement of the upper portion cycle period. This connection arrangement reassembled the traditional low cost class A amplifying circuit shown in FIG. 1 except the whole dynamic range of the amplifying circuit is configured only to drive either the upper portion cycle time or the lower portion cycle time of the signal. When the switched driving circuit 400 is studied with the speaker drawing 300, it can be observed that during the upper portion cycle time period, the speaker diaphragm is driven in between the position 316 and 318. During the lower portion cycle time period, the speaker diaphragm is driven in between the position 316 and 315 because the polarity of the speaker terminals is reversed. As a result, when the signal cycle time is considered in whole, the dynamic range of the speaker diaphragm is swinging in between position 315 and 318 which is double in distance when compared the positions 316 to 318 as in the condition of traditional class A amplifying circuit as shown in FIG. 1. The increase in speaker diaphragm substantially increases the sound pressure produced by the speaker and louder volume, less distorted output sound is achieved. If the signal powered to be dissipated by the speaker is to be maintained, the current driven through the speaker can be reduced by increasing the impedance of the speaker coil 313. Due to the nonlinear battery capacity versus loading current characteristic discussed in the summary of the invention, shifting the discharge load line of the battery substantially increases the ampere hour capacity of the battery.

Another important consideration of the power conservation is achieved by studying the midpoint biasing position of the circuit as well as the speaker diaphragm position when the signal is at the mid level neutral position. In the tradition circuit design of FIG. 1, the neutral signal mid biasing point represented by the signal levels 213 and 216 is reflected by a half voltage point at terminal 121 of FIG. 1. If the power source 111 is 6V, the voltage at terminal 121 is ideally be biased to 3V. It means during this neutral signal time or small signal time, both the speaker 112 and the transistor 113 are sharing half of the DC power as heat energy without producing much audio power. As discussed above, this neutral signal mid biasing point is represented by the speaker diaphragm position 317 as illustrated in FIG. 3. The waste of DC biasing power is eliminated by the embodiment 400 of FIG. 1. During the neutral signal midpoint both the switch control signals 515 and 516 are turned off and therefore the circuit consumes no current. When the speaker diaphragm position is considered, the neutral signal biasing position of the speaker diaphragm 314 is shifted from position 317 to 316 where 316 is a no current position of the speaker. It should be noted that the operation of small signal period of an amplifier is very close to the performance of neutral signal biasing point. The advantage of saving DC power is particularly significant when the signal amplitude is soft.

Figure 10:
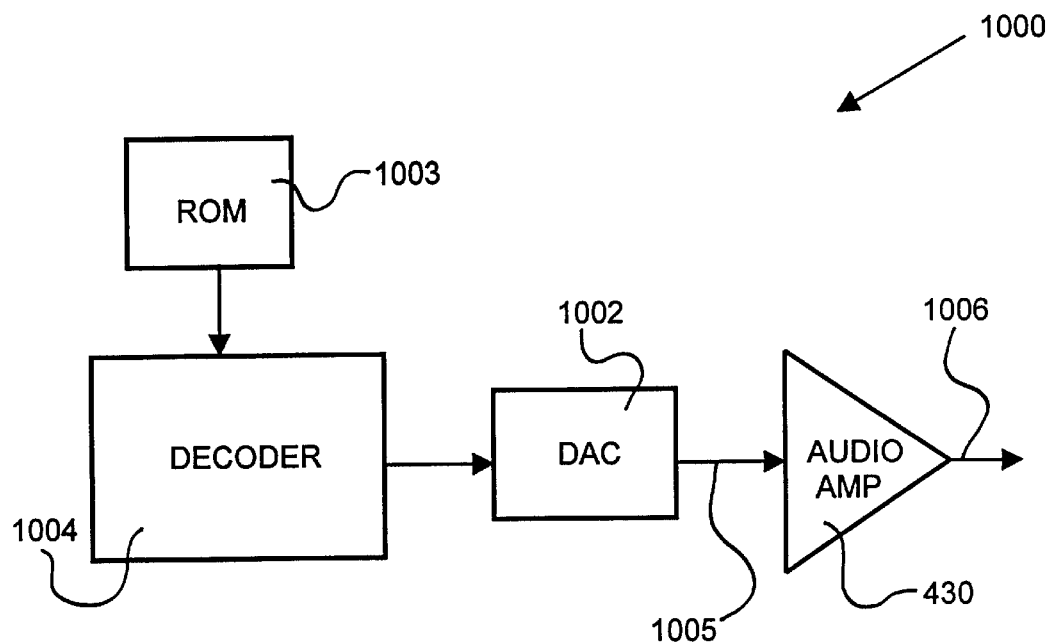
FIG. 10 illustrates a prior art example of an internal audio source derived from an internal digital data source.
Figure 11:
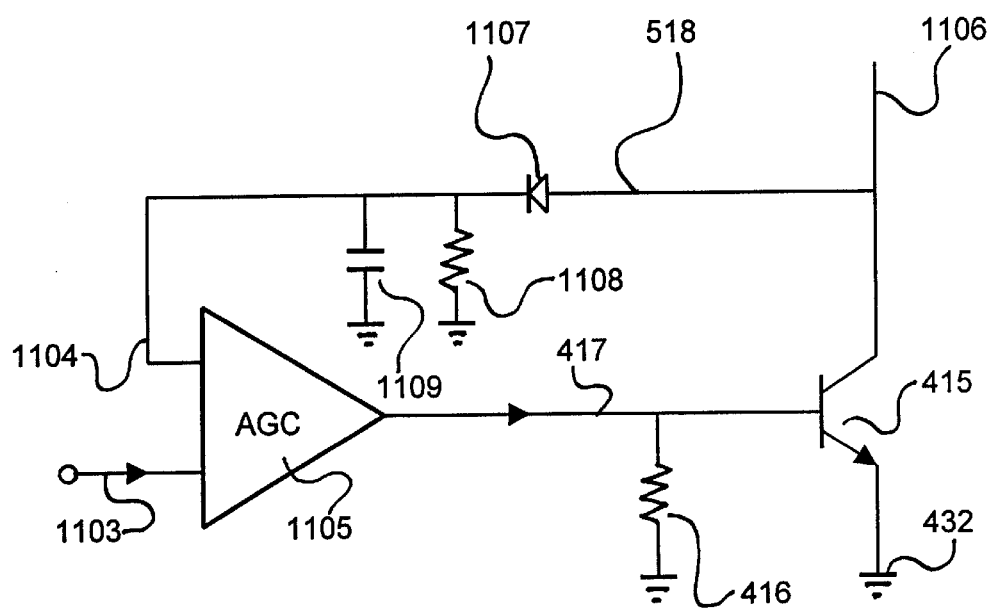
FIG. 11 illustrates a prior art example of the AGC circuit and feed back calibration circuit.

Because transistor 415 has wide variation of gain in mass production, it is desirable to obtain a reference feedback signal 518 from the output signal to calibrate the output gain according to different beta of the amplifying transistor. The feedback signal is represented by the path 518 that can then be connected to an AGC 1105 of FIG. 11 circuit for calibrating the driving signal 417. Alternately when the driving signal is derived from digital data such as 1003 of FIG. 10, a calibrating procedure can be performed at a particular output signal level so as to compensate the gain variation of the transistors.

Figure 6:
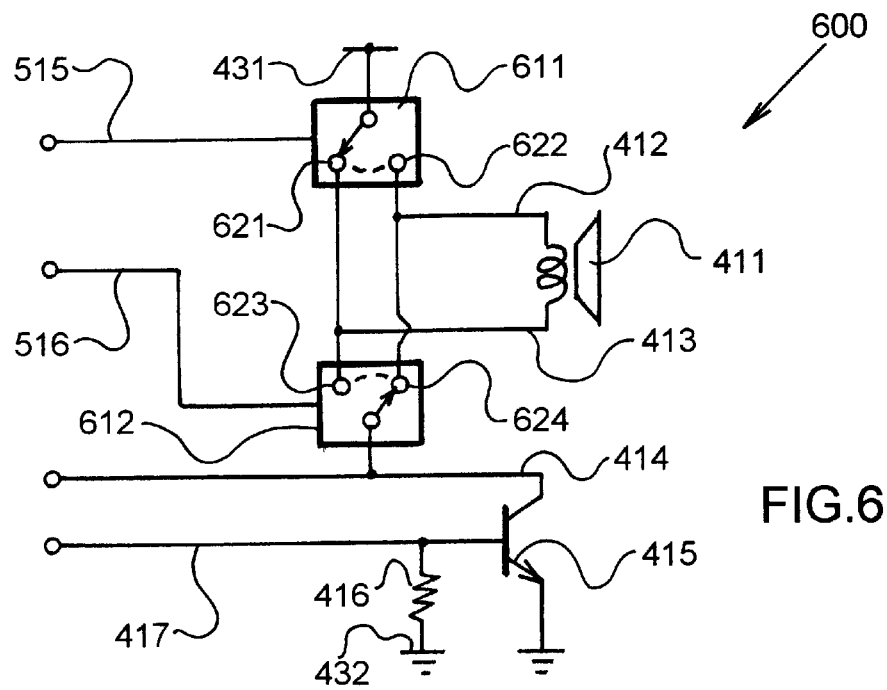
FIG. 6 is another embodiment of the invented audio amplifier.

FIG. 6 shows an alternate embodiment illustrating a slightly different switching circuit when compared with the embodiment of FIG. 5 to provide the similar performance. In FIG. 6, the one pole two throw switch 622 is equivalent to the two switches 511 and 512 of FIG. 5 and the switch 612 is equivalent to the two switches 513 and 514 of FIG. 5.

Figure 7:
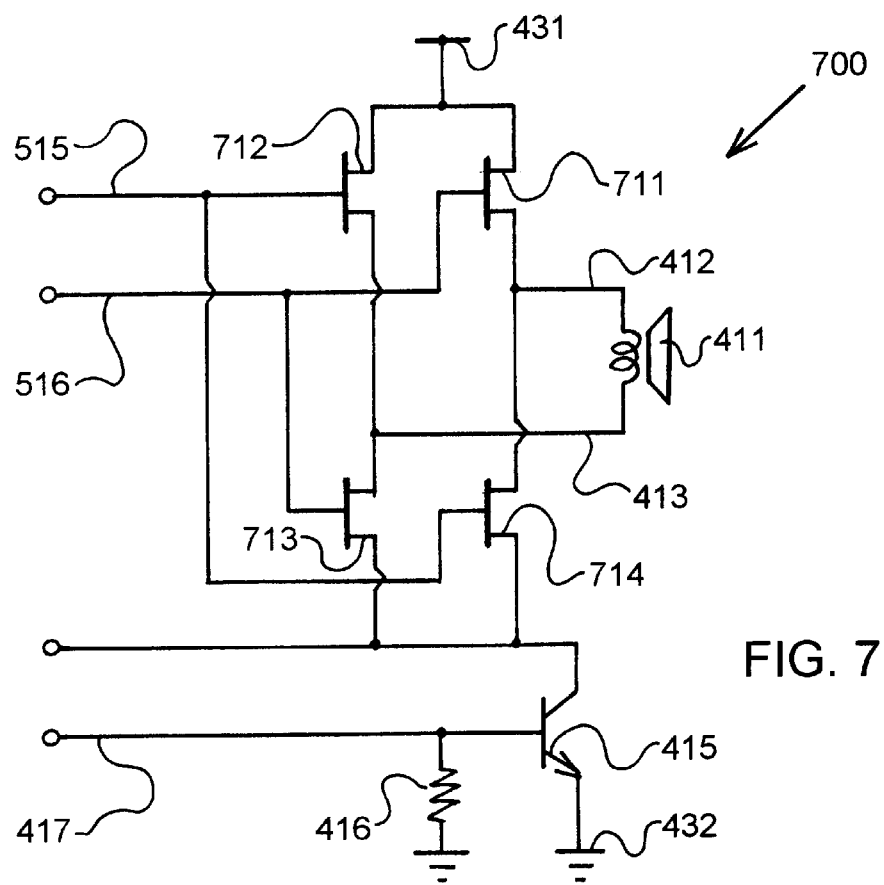
FIG. 7 is an alternate embodiment of the invented audio amplifier.

FIG. 7 shows an alternate embodiment illustrating a different representation of the switching circuit of FIG. 5. Each of the switches 511, 512, 513 and 514 are represented by the switching devices 711, 712, 713 and 714 respectively.

Figure 8:
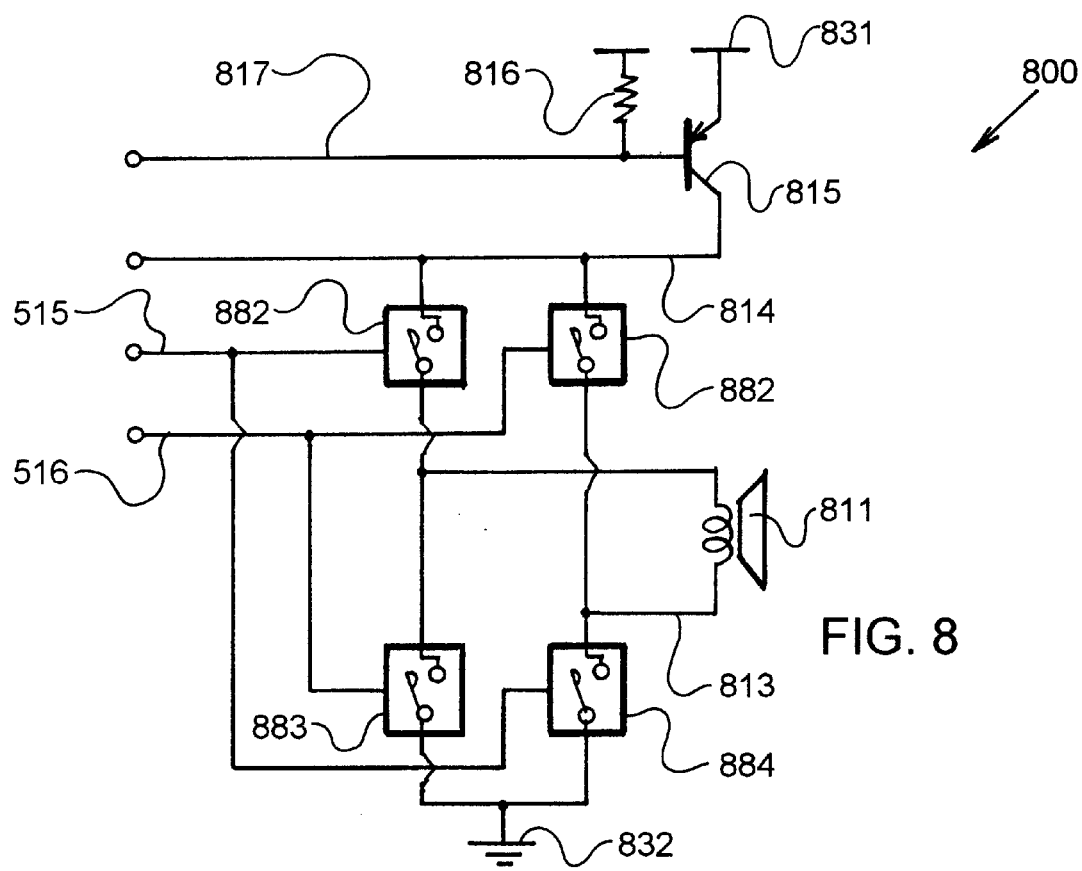
FIG. 8 is another embodiment of the invented audio amplifier.

Attention is now directed to FIG. 8 where the NPN amplifying transistor 415 of FIG. 5 is replaced by the PNP transistor 815 of FIG. 8. The working principle of the circuit is identical to that of the embodiment 400 of FIG. 5.

It should be noted that the amplifying transistor 415 is preferably to be positioned outside the amplifying IC 430 as illustrated in FIG. 4. This is because the transistor is sharing current or power with the series load during the process of AC signal amplification. The switching circuits 511, 512, 513 and 514 which dissipates very little power due to their either ON or OFF saturated switching characteristics are preferably to be located inside the IC 430 so as to minimize external component count. By arranging the power dissipating transistor outside the IC significantly reduces the chip size and packaging cost of the IC. Although only NPN, PNP and FET transistors are illustrated in the illustrated embodiments, other kinds of amplifying and switching devices or circuits are applicable within the innovative scope of the disclosure. For example, common emitter voltage amplifier and common collector current amplifier circuit are both applicable for the invented design. MOS switch and operational amplifiers can be utilized to represent the switching means and amplifying means.

Figure 9:
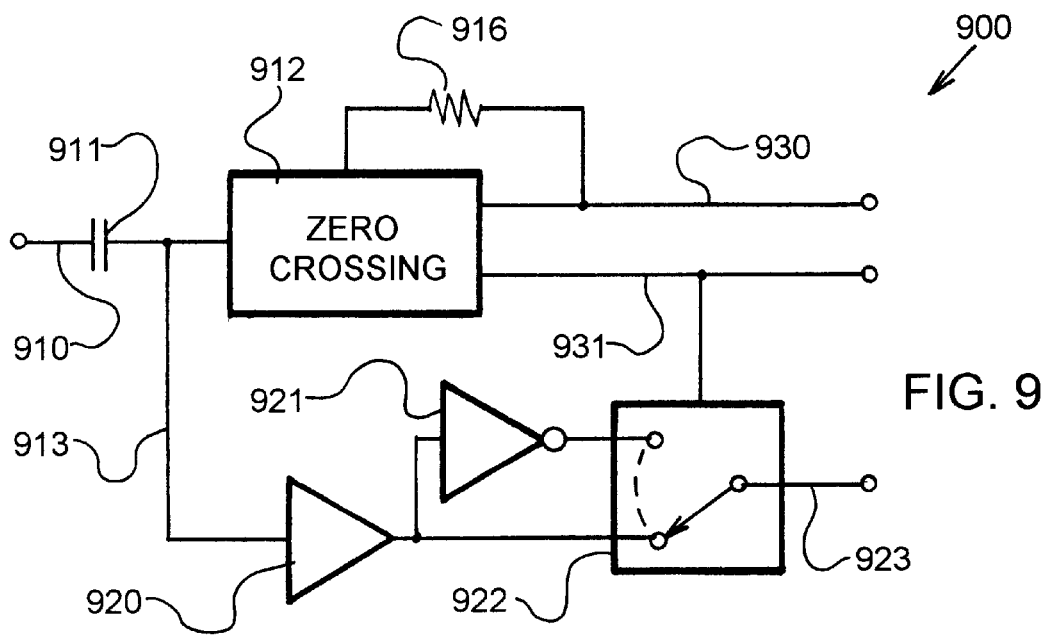
FIG. 9 is an embodiment of the invention to provide the required control signals.

FIG. 9 illustrates a circuitry to interface with the invented embodiments to provide a complete analog signal amplifier. The circuitry 900 provides the switching control signals 515, 516 and the base current 531 of FIG. 5. The source analog signal 910 is AC coupled to a zero crossing detector 912. When the source signal is at the upper portion cycle time 231 of FIG. 2, an upper signal control pulse 930 which corresponds to the control signal 515 of FIG. 5 is generated. When the source signal is at the lower portion cycle time 232 of FIG. 2, a lower signal control pulse 931 which corresponds to the control signal 516 is then generated. The feed back resistor 916 provides a hysteresis effect to the zero crossing detector such that both the upper signal control pulse and the lower signal control pulse are inhibited when the input signal is very small. An important part of the invention is that since only a single amplifying transistor is used, the source signal is to be inverted when the signal transits from the upper portion to the lower portion, or vise versa. The source signal 913 is buffered by the buffer amplifier 920 to provide a first driving signal to the switch 922. This signal is inverted by the inverting circuitry 921 to be fed to the switching circuit 922 as well. At least one of the two control signals is connected to the switching circuitry 922 such that an appropriate polarity driving signal 923 is fed to the external amplifying transistor 415 of FIG. 5. In the situation of a sound chip, recording/playback chip, and melody chip, the analog source signal is derived from an appropriate decoder 1004 of FIG. 10 or a digital to analog converter 1002. Many analog/digital signal compression algorithm has readily provided a polarity direction signal and this signal can be shared to generate the switching control signals required. It should also be noted that the memory storing the digital data representing the analog source signal may locate inside or external to the chip. In the situation of low cost melody chip, a square waveform may be generated and this waveform is considered to be a saturated analog waveform and to be considered within the scope of the claims provided the switching means and the signal control means limitations are met.

What is claimed is:

1. An apparatus having an analog signal to drive a load comprising:

a power source having at least a first polarity terminal and a second polarity terminal a load having a first terminal and a second terminal;

an analog signal source;

first switching circuit means having at least one switch connecting in between the first terminal of said load and the first polarity terminal of said power source;

second switching circuit means having at least one switch connecting in between the second terminal of said load and the second polarity terminal of said power source; and analog signal control means responsive to said analog signal source, connecting in series with said switching circuit means and said load to control the current flowing through said load.

2. The apparatus of claim 1 wherein said analog signal control means has a nonlinear transfer characteristic and said apparatus further comprising means configured to correct said nonlinear transfer characteristic.

3. The apparatus of claim 1 wherein said analog signal source having a first portion of waveform corresponding to a relative positive portion of an AC signal and a second portion of waveform corresponding to a relative negative portion of said AC signal; said switching circuit means are configured to conduct the current flowing through said load in a first direction during said relative positive portion of waveform and conduct the current flowing through said load in a second opposite direction during said relative negative portion of waveform.

4. The apparatus of claim 3 further comprising a zero crossing detector to distinguish the first and second portions of waveforms thereof.

5. The apparatus of claim 1 wherein said first and second switching circuit means locate inside an integrated circuit.

6. The apparatus of claim 5 wherein said analog signal control means locates external to said integrated circuit.

7. The apparatus of claim 5 wherein said integrated circuit receives external digital data for the formation of an analog signal to be fed to said analog signal control means.

8. The apparatus of claim 5 said analog signal source locates within said integrated circuit.

9. The apparatus of claim 8 wherein said analog signal source comprises a digital to analog converter.

10. The apparatus of claim 1 further comprising an integrated circuit and said analog signal source locates external to said integrated circuit.

11. The apparatus of claim 1 wherein said load is driven in two opposite directions from a neutral low power position.

12. The apparatus of claim 1 wherein said analog signal control means comprises a single transistor.

13. The apparatus of claim 3 further comprising means to invert said analog signal feeding to said analog signal control means when said relative positive portion of waveform transits to said relative negative portion of waveform.

14. The apparatus of claim 1 wherein said load is a sound transducer.

15. An integrated circuit comprising:
    first and second polarity terminals for receiving power from an external power source;
    first switching circuit means having at least one switch configured for connecting in series with said first polarity terminal and a first terminal of an external load;
    second switching circuit means having at least one switch configured for connecting in series with the second terminal of said external load and an external analog signal control means; and
    a signal driving terminal to deliver an analog driving signal to said external analog signal control means.

16. The integrated circuit of claim 15 comprising means to identify a relative positive portion of a waveform and a relative negative portion of a waveform; said first and second switching circuit means are configured to conduct the current flowing through said load in a first direction during said relative positive portion of waveform and conduct the current flowing through said load in a second opposite direction during said relative negative portion of waveform.

17. The integrated circuit of claim 15 further comprising a digital to analog converter locates within said integrated circuit to provide an analog signal feeding to said signal driving terminal.

18. The integrated circuit of claim 15 wherein said analog signal control means has a nonlinear transfer characteristic and said integrated circuit further comprising correction means configured to correct said nonlinear transfer characteristic.

19. The integrated circuit of claim 18 further comprising a digital to analog converter locates within said integrated circuit to provide an analog signal feeding to said signal driving terminal wherein said correction means comprising memory means representing a look up table for the conversion of the digital data processed by said digital to analog converter to compensate the nonlinear transfer characteristic of said analog signal control means.

20. The integrated circuit of claim 15 further comprising an analog input terminal to receive an analog signal for driving said external load.

21. The integrated circuit of claim 15 wherein said external load is a sound transducer.

22. The integrated circuit of claim 16 further comprising means to invert said analog signal feeding to said analog signal control means when said relative positive portion of waveform transitions to said relative negative portion of waveform.

23. A signal driving circuit responsive to an analog signal having at least a relative positive portion of waveform and a relative negative portion of waveform comprising:
    a load;
    analog signal control means responsive to said analog signal for controlling the current passing through said load;
    first switching circuit means having at least one switch configured to conduct current flow through said analog control means and said load during said relative positive portion of waveform in a first direction; and
    second switching circuit means having at least one switch configured to conduct current flow through said analog control means and said load during said relative negative portion of waveform in a second opposite direction.

24. The signal driving circuit of 23 wherein said load, each said switching circuit means and said analog signal control means are connected in series.

25. The signal driving circuit of 23 comprising a low power mode wherein both switching circuit means are turned off.

26. The signal driving circuit of claim 23 wherein said first and second switching circuit means comprise an integrated circuit; said load and said analog signal control means locates external to said integrated circuit.

27. The signal driving circuit of claim 26 wherein said analog signal control means comprises of a single transistor.

28. The signal driving circuit of claim 26 wherein said analog signal is AC coupled to an input terminal of said integrated circuit.

29. The signal driving circuit of claim 23 further comprising means to invert said analog signal feeding to said analog signal control means when said relative positive portion of waveform transits to said relative negative portion of waveform.

30. The signal driving circuit of claim 29 wherein said means inverting said analog signal is configured to operate in synchronous with the operation of said switching circuit means.

31. The signal driving circuit of claim 23 further comprising feedback and calibrating means to compensate output variation caused by variation of gain of said analog signal control means.

32. The signal driving circuit of claim 23 further configured to cut off the current flowing through said load during the time the signal transit between said relative positive portion of waveform and said relative negative portion of waveform.

* * * * *